United States Patent
Kruip et al.

(10) Patent No.: US 6,489,873 B1
(45) Date of Patent: Dec. 3, 2002

(54) TEMPERATURE CONTROL SYSTEM FOR A PERMANENT MAGNETIC SYSTEM

(75) Inventors: Marcel Jan Marie Kruip, Oxford; Nicholas David Parker, Harbury; Peter Jonathan Davis, Oxford, all of (GB)

(73) Assignee: Oxford Magnet Technology Limited, Oxford (GB)

(*) Notice: Subject to any disclaimer, the term of this patent is extended or adjusted under 35 U.S.C. 154(b) by 0 days.

(21) Appl. No.: 09/787,009

(22) PCT Filed: Aug. 23, 1999

(86) PCT No.: PCT/GB99/02782

§ 371 (c)(1),
(2), (4) Date: Jun. 12, 2001

(87) PCT Pub. No.: WO00/16118

PCT Pub. Date: Mar. 23, 2000

(30) Foreign Application Priority Data

Sep. 11, 1998 (GB) .............................. 9819694

(51) Int. Cl.⁷ .................................. H01F 5/00
(52) U.S. Cl. ........................ 335/300; 335/299
(58) Field of Search ................... 335/216, 296–300; 324/318–321; 505/892–8

(56) References Cited

U.S. PATENT DOCUMENTS 5,652,517 A 7/1997 Maki et al. ............... 324/318
5,936,502 A * 8/1999 Englund et al. ............. 335/299

FOREIGN PATENT DOCUMENTS

| JP | 3-109042 | 5/1991 |
| JP | 4357936 | 10/1992 |
| JP | 7-327958 | 12/1995 |

OTHER PUBLICATIONS

Copy of British Search Report (No date).

* cited by examiner

*Primary Examiner*—Lincoln Donovan
(74) *Attorney, Agent, or Firm*—Crowell & Moring LLP

(57) ABSTRACT

A temperature control system for a permanent magnetic assembly in a permanent magnetic system comprises thermoelectric heat pumping devices which are in thermal contact with a yoke of the permanent magnet system. The heat pumping devices are controlled by an electronic circuit which controls the current that flows through them, so that the desired temperature of the permanent magnetic assemblies is achieved. Each thermoelectric heat pumping device includes a spring-loaded plunger which is mounted in a hole in the yoke.

Heat is exchanged from or to the yoke via ambient air by natural convection or by forced air. Alternatively heat may be exchanged from the yoke via a cooling water circuit.

14 Claims, 2 Drawing Sheets

TEMPERATURE CONTROL SYSTEM FOR A PERMANENT MAGNETIC SYSTEM

BACKGROUND OF THE INVENTION

The present invention relates to a temperature control system for a permanent magnet system and in particular it relates to systems used for magnetic resonances imaging (MRI).

In such systems a magnetic field with a high degree of stability and homogeneity is essential for the successful application of a number of analytical techniques such as MRI. MRI systems comprising large amounts of permanent magnetic material can be used for the generation of such a magnetic field.

Most permanent magnetic materials with sufficient energy density to be useful for this application are generally very sensitive to temperature variations. The effect of the temperature variations on the air temperature of the permanent magnetic assembly can be reduced to tolerable levels by controlling the temperature of the permanent magnetic assembly. Thus, the temperature control of existing permanent magnet MRI assemblies rely on raising the temperature of the permanent magnetic assemblies so that heat flows to the ambient air. This technique, however, raises the temperature of the permanent magnetic assemblies and results in a significant reduction of field due to the large temperature coefficient of the permanent magnetic materials.

SUMMARY OF THE INVENTION

One object of the present invention is to provide a system for controlling accurately the temperature of the permanent magnetic assemblies.

According to the present invention there is provided a temperature control system for a permanent magnet system having at least one permanent magnetic assembly, in which the permanent magnet assembly is mounted in thermal contact with a yoke via a plurality of thermoelectric heat pumping devices. At least one temperature sensor is connected to an electronic control circuit; and the thermoelectric heat pumping devices are connected to and controlled by the electronic control circuit which controls the current passing through the thermoelectric heat pumping devices in dependence upon the temperature. In this way, the permanent magnet assembly is maintained at a desired temperature enabling the permanent magnet system to generate an accurate magnetic field.

According to an aspect of the present invention a thermoelectric heat pumping device is provided with a spring loaded plunger to provide mechanical pressure on the thermoelectric heat pumping device so that a good thermal contact between the thermoelectric heat pumping device and the permanent magnet assembly is achieved.

According to a further aspect of the present invention the thermal contact between the plunger and the yoke is achieved by a sliding fit of one end of the plunger with a hole in the yoke into which the said one end of the plunger is fitted.

According to still yet a further aspect of the present invention thermal grease is enclosed within said hole, and the plunger is provided with a ventilation hole to prevent displacement of the grease by trapped air as said one end of the plunger is inserted into said hole.

Other objects, advantages and novel features of the present invention will become apparent from the following detailed description of the invention when considered in conjunction with the accompanying drawings.

DETAILED DESCRIPTION OF THE INVENTION

Permanent magnetic assemblies are in general mounted on a large structure which, apart from providing mechanical support, also provides a magnetic return path for the magnetic field. This structure is commonly referred to as a yoke. The yoke is, in general, a structure of considerable size and has a significant thermal capacity.

In accordance with the present invention, the temperature of the permanent magnetic assembly is controlled by transferring heat to and from the yoke via the thermoelectric heat pumping devices.

Figure 1:
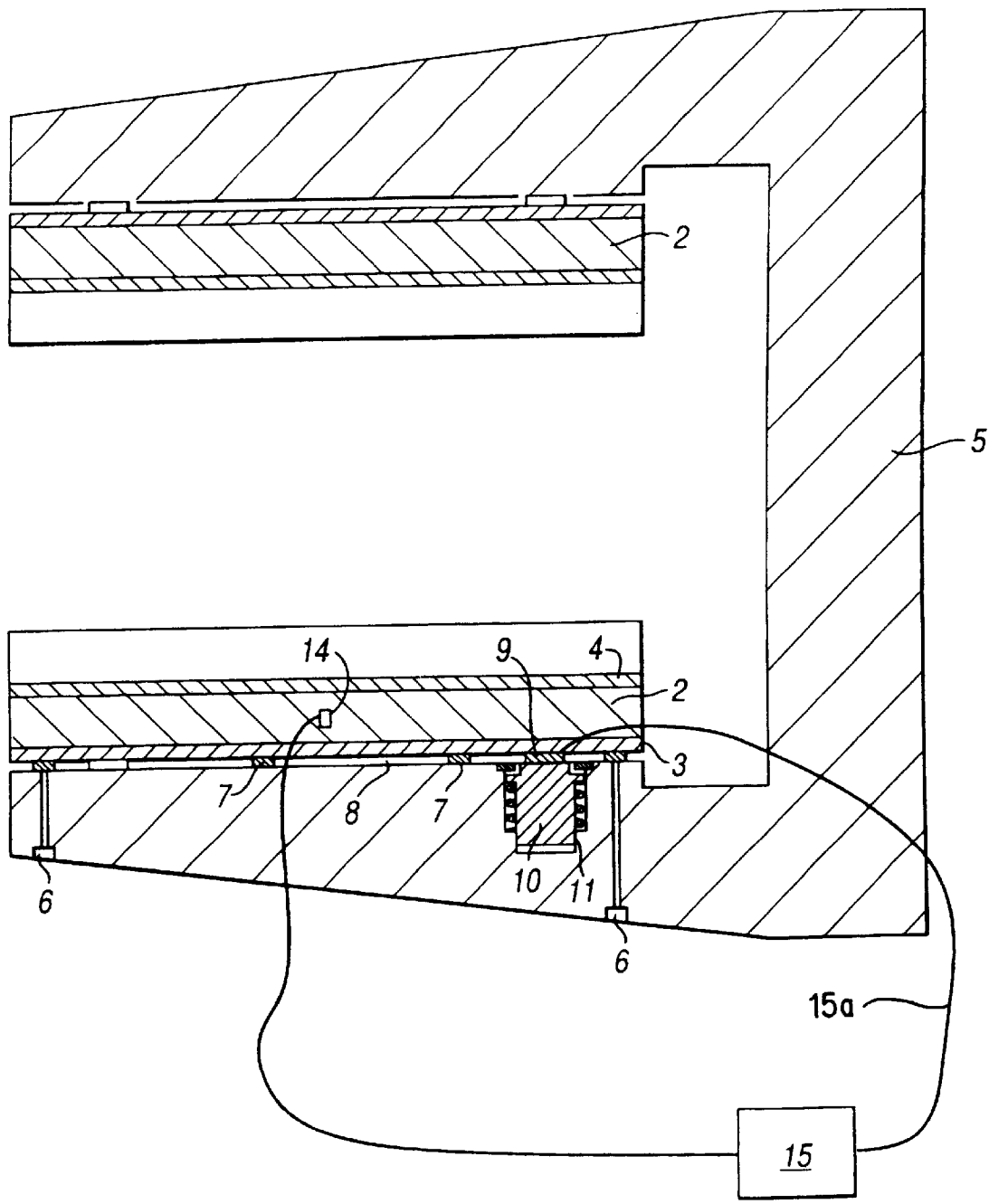
FIG. 1 shows an example of a permanent magnetic assembly.

Referring to FIG. 1, a permanent magnetic assembly 1 consists of layer of permanent magnetic material 2 glued between plates 3,4. At least plate 3 has good thermal conductivity. The permanent magnetic assembly is bolted to the yoke 5 with bolts 6 having low thermal conductivity. Spacers 7, made of poor thermal conducting material, maintain a space 8 between the permanent magnetic assembly and the yoke 5. This space acts as a thermal barrier, and may be filled with a thermal insulating material. One or more thermoelectric heat pumping devices 9 are mounted inside the space 8. The mechanical pressure required to ensure good thermal contact with the permanent magnetic assembly is provided by spring loaded devices 10, referred to as plungers. A plunger is shown in greater detail with reference to FIG. 2.

Figure 2:
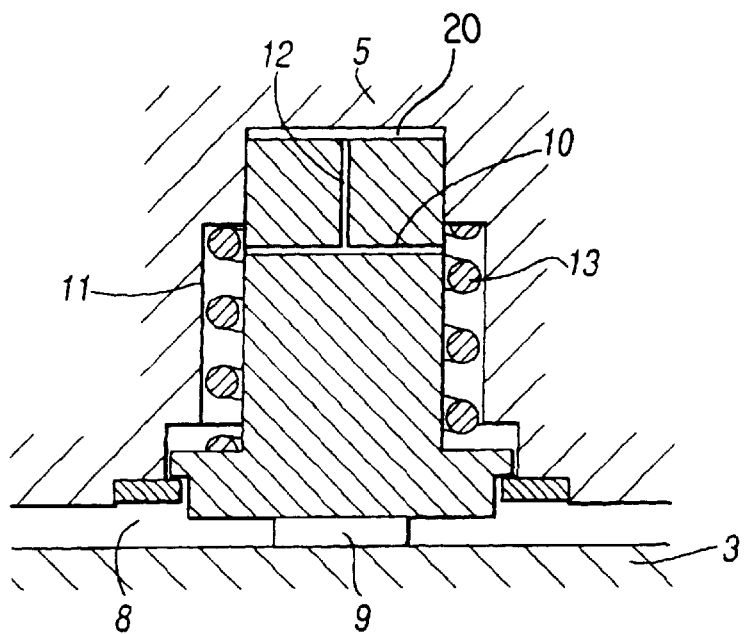
FIG. 2 shows an example of a plunger.

In FIG. 2, identical parts shown in FIG. 1 bear the same reference numeral.

The top end of the plunger provides a sliding fit with a hole 11 in the yoke 5. Thermal conducting grease 20 is inserted into a gap between the hole and the plunger to ensure good thermal contact between the plunger and the yoke. The top end of the plunger is provided with a ventilation channel 12 to prevent the displacement of grease by trapped air when inserting the plunger into the counter bored hole 11 inside the yoke 5. Making the thermal contact at the top end of the plunger avoids large temperature gradients near the thermoelectric heat pumping devices, which would reduce the performance of the heat pumping devices. The radial gap between the plunger 10 and the yoke 5, apart from the sliding fit at the top, acts as a thermal barrier. The gap is used to accommodate a spring 13 that provides mechanical pressure on the plunger 10. The permanent magnetic assemblies are fitted with temperature sensors 14 which are connected to an electronic control circuit 15. The latter in turn is connected to the thermoelectric heat pumping devices via a connection 15a, and controls the current to the thermoelectric heat pumping devices. Depending on the polarity of the current in the thermoelectric heat pumping devices, the latter can be made to pump heat to or from the permanent magnetic assemblies, which will increase or decrease the temperature respectively. The heat transferred to the yoke 5 including the heat due to dissipation of the thermoelectric heat pumping devices must be exchanged with the environment of the magnet. This can be achieved by natural conduction from the yoke 5 to surface air. Alternatively heat could be exchanged to a liquid cooling circuit as shown in FIG. 3.

Figure 3:
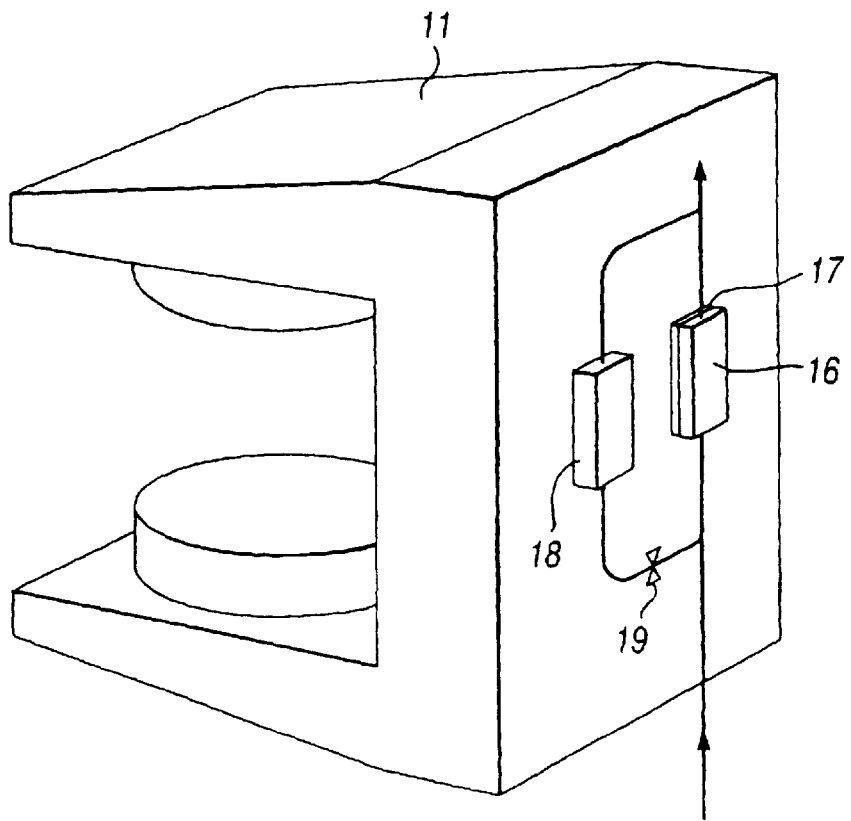
FIG. 3 shows a view of a C-shaped magnetic assembly having a heat exchanger connected thereto.

Referring to FIG. 3, a heat exchanger is provided which is mounted to the yoke 5. The thermal contact between the exchanger and the yoke could have a moderate thermal resistance. This, together with the thermal capacitance of the yoke constitutes a certain amount of filtering which makes the system less sensitive to variations in the temperature of the cooling water. The thermal resistance could be achieved by a pad of thermally insulating materials 17 inserted between the first heat exchanger at 16 and the yoke 5. A second heat exchanger 18 with good thermal contact can be also mounted to the yoke 5, and the flow of cooling liquid to the second heat exchanger 18 is controlled by a valve 19 in one of the conduits feeding the heat exchangers. The second heat exchanger 18 can be used to settle a temperature of the yoke to the cooling water temperature in a reduced amount of time. This results in a time saving during the installation process of the magnet on site.

Each permanent magnetic assembly may be controlled by the same, common, electronic control circuit, or may each be controlled independently by separate electronic control circuits.

While the present invention has been described with reference to a C shaped magnet it will be appreciated that it is applicable to other forms of magnet.

The present invention allows regulation of the temperatures of the permanent magnetic material above, below or at the temperature of the heat source/sink of the magnetic system. When permanent magnetic materials with a significant negative temperature coefficient are used, such as NdFeB or ferrite, the problem of a reduced performance of the permanent magnetic material due to raised temperature operation is avoided resulting in a saving of permanent magnetic material. Furthermore, the devices which apply pressure to the thermoelectric heat pumping devices do not impair the magnetic efficiency of a ferromagnetic yoke if the pressure devices are made of ferromagnetic material.

The cooling circuit may have a control valve in each leg, and the bore of the conduit to the second heat exchanger may be wider than that of the conduit to the first heat exchanger.

The system described above, operates at a near ambient temperature and therefore avoids the need to raise the system above ambient temperature as in the prior art which leads to a consequential loss of performance.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A temperature control system for a permanent magnet system having at least one magnetic assembly, which is mounted in thermal contact with a yoke via a plurality of thermoelectric heat pumping devices, and having at least one temperature sensor connected to an electronic control circuit, said thermoelectric heat pumping devices being connected to and controlled by said electronic control circuit which controls the current passing through said thermoelectric heat pumping devices dependent upon sensed temperature, so that the permanent magnet assembly is maintained at a desired temperature enabling the permanent magnet system to generate a stable and homogeneous magnetic field.

2. A temperature control system as claimed in claim 1, wherein each thermoelectric heat pumping device is provided with a spring loaded plunger to provide mechanical pressure on the thermoelectric heat pumping device so that a good thermal contact between the theremoelectric heat pumping device and the permanent magnet assembly is achieved.

3. A temperature control system as claimed in claim 2, wherein the thermal contact between the plunger and the yoke is achieved by a sliding fit of one end of the plunger with a hole in the yoke into which the said one end of the plunger is fitted.

4. A temperature control system as claimed in claim 3, wherein thermal grease is enclosed within said hole, at the top of the plunger, and the plunger is provided with a ventilation channel to prevent displacement of the grease by trapped air as said one end of the plunger is inserted into said hole.

5. A temperature control system as claimed in claim 1, wherein heat is exchanged from or to the yoke by ambient air by natural convection or by forced air.

6. A temperature control system as claimed in claim 1, wherein heat is exchanged for or to the yoke via a cooling water circuit.

7. A temperature control system as claimed in claim 6, wherein the cooling water circuit comprises a first heat exchanger arranged in parallel with a second heat exchanger, and flow of cooling water is controlled to said second heat exchanger by at least one valve, said second heat exchanger being in good thermal contact with the yoke and s used to minimise the temperature difference between the yoke and the cooling circuit in a reduced time when the permanent magnet system is installed.

8. A temperature control system as claimed in claim 7, wherein a layer of material having low thermal conductivity is applied between the yoke and the first heat exchanger to reduce variations in the heat flow and temperature in the yoke due to variations in the temperature of the cooling circuit.

9. A temperature control system as claimed in claim 2, wherein each permanent magnetic assembly is controlled by common electronic control circuit or is independently controlled by a separate electronic control circuit.

10. A temperature controlled permanent magnet system, comprising:
    at least one permanent magnet assembly;
    a yoke;
    a plurality of thermoelectric heat pumping devices mounted in heat flow communication between said at least one magnet assembly and said yoke, said heating pumping devices being operative to pump heat between said at least one magnetic assembly and said yoke, in a direction dependent on a direction of current flow therein;
    at least one temperature sensor mounted to said at least one magnet assembly, for sensing a temperature thereof; and
    means for maintaining said at least one magnet assembly at a desired temperature, by controlling a flow of electric current through said plurality of thermoelectric heat pumping devices as a function of temperature of said at least one magnet assembly sensed by said at least one temperature sensor, whereby said permanent magnet system is enabled to generate a stable and homogeneous magnet field.

11. The system according to claim 10, wherein said means for maintaining comprises an electronic control circuit which is coupled to receive output signals from said at least one temperature sensor and is connected to said plurality of thermoelectric heat pumping devices.

12. The system according to claim 11, wherein each of said thermoelectric heat pumping devices includes a spring loaded plunger which is in thermal contact with said at least one magnet assembly at a first end of said plunger, and is in thermal contact with said yoke at a second end of said plunger.

13. The system according to claim 12, wherein said spring loaded plunger is spring biased against said permanent magnet at said first end, and is inserted in a hole in said yoke at said second end.

14. The system according to claim 13, wherein thermal grease is enclosed in said hole, adjacent said second end of said plunger.

* * * * *